United States Patent [19]

Eckstein et al.

[11] Patent Number: 5,691,280

[45] Date of Patent: Nov. 25, 1997

[54] METHOD OF PRODUCING A HIGH $T_C$ SUPERCONDUCTING FILM FREE OF SECOND PHASE DEFECTS

[75] Inventors: James N. Eckstein, Cupertino; Ivan Bozovic, Palo Alto, both of Calif.

[73] Assignee: Varian Associates, Inc., Palo Alto, Calif.

[21] Appl. No.: 648,780

[22] Filed: May 14, 1996

Related U.S. Application Data

[63] Continuation of Ser. No. 405,419, Mar. 15, 1995, abandoned, which is a continuation of Ser. No. 97,703, Jul. 27, 1993, abandoned.

[51] Int. Cl.[6] .................................................. H01L 39/24
[52] U.S. Cl. .......................... 505/329; 505/473; 505/474; 505/475; 505/702; 505/729; 427/62; 427/419.3; 427/596
[58] Field of Search ................................. 505/329, 473, 505/474, 475, 702, 729; 427/62, 63, 419.3, 596

[56] References Cited

PUBLICATIONS

Horiuchi et al., "$Bi_2Sr_2Ca$, $Cu_2O_8/Bi_2Sr_2Cu_1O_6$ Superconducting Superlattices Modulation of the Number of $CuO_2$ Plane Between $Bi_2O_2$ Layers", Jpn. J. Appl Phys. vol. 30 No. 8A, Aug. 1991, pp. L1381–1383.

Matsumoto et al., "Layer–by–Layer Epitaxial Growth of a $Bi_2Sr_2CuO_8$ Thin Film on a $Bi_2Sr_2Ca$ $Cu_2O_8$ Single Crystal", Appl. Phys. Lett. 58(16) May 1991, pp. 2039–2041.

Mizuno et al, "Fabrication of Thin–Film Type Josephson Junctions Using a Bi–Sr–Ca–Cu–O/Bi–Si–Cu–O/Bi–Sr–Ca–Cu–O Structure", Appl. Phys. Lett. 56(15) Apr. 1990 pp. 1469–1471.

Nakayama et al, "In Situ Growth of Bi–Sr–Ca–Cu–O Thin Films by Molecular Beam Epitaxy Technique with Pure Ozone", Jpn. J. Appl. Phys. vol. 28, No. 7, Jul., 1989, pp. L1217–L1219.

Nakao et al, "Superconductivity in BiSrCaCuO Superlattices: Two–Dimensional Properties of CuO Planes", Jpn. J. Appl. Phys. 30(12B) Dec. 1991, pp. 3929–3932.

Article by I. Bozovic et al., entitled In–Situ Growth of Superconducting Single Crystal Bi–Sr–Ca–Cu–O Thin Films by Molecular Beam Epitaxy, published in *Science and Technology of Thin Film Superconductors 2*, 1990, pp. 267–272.

Article by I. Bozovic et al., entitled Superconductivity in Epitaxial $Bi_2Sr_2CuO_6/Bi_2Sr_2CaCu_2O_8$ Superlattices: The Superconducting Behavior of Ultrathin Cuprate Slabs, published in *Journal of Superconductivity*, on 1992, v. 5, No. 1, pp. 19–23.

Article by J. N. Eckstein et al., entitled Atomically Layered Heteroepitaxial Growth of Single–Crystal Films of Superconducting $Bi_2Sr_2Ca_2Cu_3O_x$, published in *Appl. Phys. Lett.*, on Aug. 27, 1990, 57 (9) pp. 931–933.

Article by Klausmeier–Brown, M.E. et al., entitled Accurate Measurement of Atomic Beam Flux by Pseudo–Double–Beam Atomic Absorption Spectroscopy for Growth of Thin–Film Oxide Superconductors, published in *Appl. Phys. Lett.*, on Feb. 3, 1992, 60 (5), pp. 657–659.

*Primary Examiner*—Roy V. King
*Attorney, Agent, or Firm*—Gerald Fisher

[57] ABSTRACT

A thin film which is substantially free of measurable surface defects due to second-phase inclusions is disclosed. The film is composed of multilayered strata of a first metal oxide interspersed with single molecular layers of a second metal oxide, where the second metal oxide is effective to absorb second-phase defects which form in the first oxide layers.

13 Claims, 5 Drawing Sheets

METHOD OF PRODUCING A HIGH $T_C$ SUPERCONDUCTING FILM FREE OF SECOND PHASE DEFECTS

This application is a continuation of application Ser. No. 08/405,419, filed Mar. 15, 1995, which is a continuation of application Ser. No. 08/097,703, filed Jul. 27, 1993 both of them abandoned.

The present invention was supported in part by Grant ONR/DARPA Contract N00014-88-C-0760. The government has certain rights in this invention.

FIELD OF THE INVENTION

The present invention relates to a thin film that is substantially free of second-phase defects, and to a method of making such thin films.

REFERENCES

Bozovic, I., et al., *Science and Technology of Thin Film Technology II* (R. McConnell, et al., eds.), Plenum, N.Y. p.267 (1990).

Bozovic, I., et al., *Journal of Superconductivity* 5:19 (1992).

Eckstein, J. N., et al., *Appl. Phys. Lett.* 57:531 (1990).

Klausmeier-Brown, M. E., et al., *Appl. Phys. lett*, 60:657 (1992).

BACKGROUND OF THE INVENTION

In many modern electronic device applications, one of the key materials is that a thin film of some compound can be deposited on an appropriate substrate. A good film morphology is frequently required, and usually that means that a film should be flat and smooth, without formation of inclusions of other phases.

One important example is found in the area of high-$T_c$ Josephson junctions, which are currently at the focus of research efforts worldwide. Since the coherence lengths in cuprate superconductors are very short (2–20 Å), virtually perfect crystalline order must be maintained on an atomic scale. In particular, formation of second-phase inclusions cannot be tolerated, because such defects introduce variations in junction properties and can even short-circuit a junction and render it useless.

The problem, however, is that occurrence of such second-phase defects is a very common, almost ubiquitous phenomenon, in particular for the case of high-$T_c$ superconductors from the Bi—Sr—Ca—Cu—O family. In technical terms, the "window" in the pressure-temperature-stoichiometry phase space is very narrow, if it exists at all. This is true particularly for the more interesting phases which contain several $CuO_2$ planes per unit cells and which have higher critical temperatures.

SUMMARY OF THE INVENTION

The invention includes, in one general aspect, an improved method of producing a thin film having selected conduction or magnetic properties, by deposition of successive molecular layers of a metal oxide having desired magnetic and/or conducting properties, such as superconducting properties. The metal oxide is one which has a metastable phase or which otherwise tends to form second-phase defects on successive-layer deposition unless specific adjustments in the stoichiometries of the metals forming the oxide are made as the individual layers are being deposited.

In other words, the deposited metal oxide has a relatively narrow temperature-pressure-stoichiometry phase acceptance window.

The improvement includes interspersing among multi-layer strata forming the thin film, at specified multi-layer intervals, a molecular layer of a second metal oxide which has a wider temperature-pressure-stoichiometry phase acceptance window than, the first metal oxide. The second metal oxide is one which is compatible with the first metal oxide in lattice structure and chemical and electronic properties, typically a metal oxide from the same polytype family as the first metal oxide. The interspersed layers are effective to absorb second-phase imperfections formed in the first metal-oxide layers, thus preventing crystal imperfections in the thin film, and growth of second-phase defects. At the same time, the conduction or magnetic properties of the bulk thin-film metal oxide layers are largely unaffected by the presence of the interspersed defect-absorbing layers.

In one embodiment, the method is employed for producing a high-temperature superconducting (HTS) thin film, for example, for producing the two HTS thin layers in a Josephson junction. In this embodiment, the first metal oxide, but not the second metal oxide, has high $T_c$ conduction properties, when deposited in lattice-matched molecular layers. In one exemplary thin film of this type, the polytype family of the first and second metal oxides is a $Bi_2Sr_2Ca_{(n-1)}Cu_nO_{2n+4}$ oxide, where n is 2 or 3, in the first metal oxide and is equal to 1 in the second metal oxide, e.g., where the first metal oxide is $Bi_2Sr_2Ca_1Cu_2O_8$, and the second metal oxide is $Bi_2Sr_2CuO_6$.

In a related aspect, the invention includes a method of producing a high $T_c$ superconducting thin film which is substantially free of measurable surface defects due to second-phase inclusions. The method includes depositing multilayered strata composed of multiple molecular layers of a high-$T_c$ polytype metal oxide characterized by a relatively narrow temperature-pressure-stoichiometry phase acceptance window, under deposition conditions in which second-phase imperfections form during successive layer deposition.

The strata are interspersed by preferably single molecular layers of a low-$T_c$ metal oxide which is in the same polytype family as, but which has a wider temperature-pressure-stoichiometry phase acceptance window than, the high $T_c$ metal oxide, whereby the low-$T_c$ defect-absorbing layer absorbs second-phase imperfections formed in the strata.

Also forming part of the invention is a thin film which is substantially free of measurable surface defects due to second-phase inclusions. The film includes a plurality of strata, each formed of multiple molecular layers of a first metal oxide characterized by a relatively narrow temperature-pressure-stoichiometry phase acceptance window, and separating adjacent strata, a molecular layer of a second metal oxide which is in the same polytype family as, but which has a wider temperature-pressure-stoichiometry phase acceptance window than, said first metal oxide.

In one general embodiment, the thin film is a superconducting thin film, where the polytype metal oxide is a $Bi_2Sr_2Ca_{(n-1)}Cu_nO_{2n+4}$ oxide, with n being equal or greater than 2 in the first metal oxide and equal to 1 in the second metal oxide. Exemplary first and second metal oxides of this type are $Bi_2Sr_2Ca_1Cu_2O_8$, and $Bi_2Sr_2CuO_6$, respectively.

In a related embodiment, the invention includes a high $T_c$ superconducting thin film which is substantially free of measurable surface defects due to second-phase inclusions.

The film includes a plurality of strata, each formed of multiple molecular layers of a high-$T_c$ polytype metal oxide characterized by a relatively narrow temperature-pressure-stoichiometry phase acceptance window, and separating adjacent strata, a molecular layer of a low-$T_c$ metal oxide which is in the same polytype family as, but which has a wider temperature-pressure-stoichiometry phase acceptance window than, said high $T_c$ metal oxide.

Also forming part of the invention is a high-$T_c$ trilayer Josephson junction in which first and second HTS thin films have the strata/defect-absorbing layer construction described above.

These and other objects and features of the invention will be more fully understood when the following detailed description is read in conjunction with the accompanying drawings.

DETAILED DESCRIPTION OF THE INVENTION

I. Definitions

The terms below have the following meaning herein, unless otherwise noted.

A "polytype family" of metal oxides is a family of metal oxides, each member of the family having a different stoichiometric amount of at least one metal forming the oxide. For example, the polytype metal oxide is a $Bi_2Sr_2Ca_{(n-1)}Cu_nO_{2n+4}$ oxide is a family of metal oxides with different stoichiometric amounts of Ca and Cu, depending on the value of n. The value of n may vary from integral values.

A "molecular layer" of a metal oxide refers to the minimum stack of atomic layers sufficient to make up crystallographic unit cells of the oxide, as illustrated below in FIG. 2A.

A "temperature-pressure-stoichiometry phase window" refers to the ranges of temperature and pressure deposition conditions, and stoichiometry of deposited atoms within which essentially crystalline order in deposited molecular layers is maintained.

"Second-phase defects" refer to imperfections in atomic layer crystal structure characterized by the growth of inclusions of other phases or compounds between adjacent molecular layers.

The "critical temperature for zero resistivity" or "$T_c$ (zero)" is the temperature at which a superconductor compound first shows zero resistivity, as the temperature of the compound is lowered.

The "plane of a thin-film compound" is a plane parallel to the atomic planes forming the molecular layers of the compound.

II. Thin Film with Suppressed Defects

Figure 1:
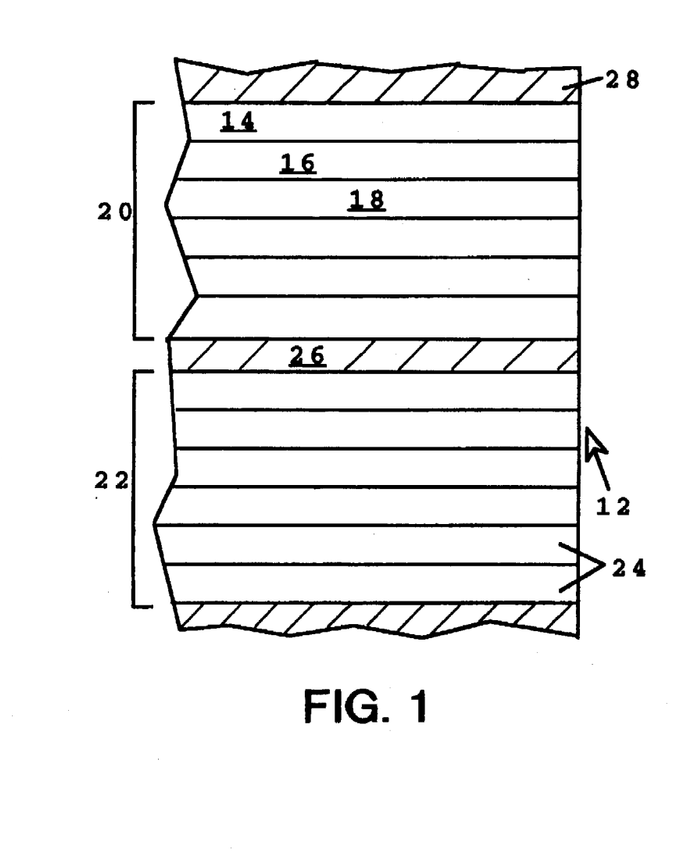
FIG. 1 is a schematic cross-sectional view of an HTS thin film formed in accordance with one embodiment of the invention.

FIG. 1 shows a thin film device 10 constructed in accordance with the invention. The device includes a substrate (not shown) and a thin film 12 supported on the substrate. The substrate is preferably a nonconductive and/or non-magnetic substrate, such as an $SrTiO_3$ substrate, and the thin film is a deposited thin film having desired magnetic or conductivity properties. For example, the thin film may be suitable for magnetic thin-film recording, or have suitable conduction or semi-conductor properties, such as conduction properties of a high-temperature superconductor (HTS). As will be seen below, the device may additionally include other layers, such as a barrier layer and a second HTS layer in a HTS Josephson junction.

Film 12 is composed of molecular layers, such as layers 14, 16, 18, of a metal oxide from a polytype metal oxide family having the desired property, e.g., HTS property. Polytype families of cuprate oxide polytype metal oxides which may be used in forming HTS thin layers include: (i) $M_1Ba_2Cu_3O_{7-x}$, where M is Y, Nd, La, Sm, Eu, Gd, Dy, Ho, Er, Tm, Yb, or Lu ("1-2-3" or "yttrium" compound); (ii) $Bi_2Sr_2Ca_{n-1}Cu_nO_{2n+4}$ where n=2-5 ("bismuth" compound); (iii) $Tl_xBa_2Ca_{n-1}Cu_nO_{2n+2x+2}$, where x=1 or 2, n=1-5, ("thallium" compound); or (iv) $La_{2-x}[Sr,Ca,Ba]_xCuO_4$, where x=0–0.3 ("lanthanum" compound). Alternatively, metal oxides having desired semi-conductor or magnetic properties may be selected.

The molecular layers in the thin film having the desired conduction, or magnetic properties are deposited in multilayer strata, such as strata 20, 22 shown in the figure. Stratum 20 is formed of layers 14, 16, 18 and the three underlying layers, and stratum 22 is likewise formed of six layers, such as layers 24. More generally, the layers forming each of the strata are formed of a polytype metal oxide having a narrow temperature-pressure-stoichiometry phase acceptance window, as evidenced by the tendency of the metal oxide to form second-phase defects as successive molecular layers of the metal oxide are deposited, as will be discussed below with respect to FIGS. 2A and 2B below. The strata typically contain between about 3–20 stacked molecular layers, preferably between about 4–8 layers.

The multilayer strata in the thin film are separated from one another by single molecular defect-absorbing layers of a second metal oxide which has a wider temperature-pressure-stoichiometry phase acceptance window. The second metal oxide is one which is compatible with the first metal oxide in lattice structure, and in electronic and chemical properties, and is typically one selected from the same polytype family as the first metal oxide. The wider window allows the second metal oxide to absorb second-phase defects or imperfections that form in the strata, as will be described below with respect to FIG. 3. At the same time, the defect-absorbing layers do not significantly effect the conductivity or magnetic properties of the multilayer strata, even though the defect-absorbing layers themselves may lack the desired property, e.g., HTS property.

Typically, the second metal oxide used in forming the single defect-absorbing layers are those having simple stoichiometries, e.g., a metal oxide having the simplest stoichiometry in the same polytype family. For example, in a $Bi_2Sr_2Ca_{n-1}Cu_nO_{2n+4}$ polytype oxide, where the metal oxide used in forming the HTS layer has an n value of 2 or 3, the defect-absorbing layer is preferably $Bi_2Sr_2CuO_6$, i.e., where n=1. Similarly, in a thallium HTS compound of the type $Tl_xBa_2Ca_{n-1}Cu_nO_{2n+2x+2}$, where x=1 or 2, n is 2 or greater, the defect-absorbing layer is preferably $Tl_xBa_2CuO_{2x+4}$, i.e., where n=1. In general, the more complex the stoichiometry, the greater number of atomic layers which are required to form a molecular layer, and the greater the likelihood of crystal imperfections.

The general features of the invention discussed above are illustrated in FIGS. 2 and 3. These figures show the atomic layers making up perfect $Bi_2Sr_2Ca_1Cu_2O_8$ crystalline molecular layers (FIG. 2A), $Bi_2Sr_2Ca_1Cu_2O_8$ crystalline molecular layers with Cu-excess defects (FIG. 2B), and $Bi_2Sr_2CaCu_2O_8$ crystalline molecular layers in which the Cu-excess defect in FIG. 2B is absorbed by a single $Bi_2Sr_2CuO_6$ metal oxide layer. In the figure, the solid circles represent Bi, the open circles, oxygen, the shaded circles, Sr, the smaller circles, Cu, and the circled X's, Ca. The perfect-crystal layers in FIG. 2A are indicated at 14', 16', 18', corresponding to the Cu-excess layers 14, 16, 18, respectively in FIGS. 1, 2B, and 3.

Figure 2A:
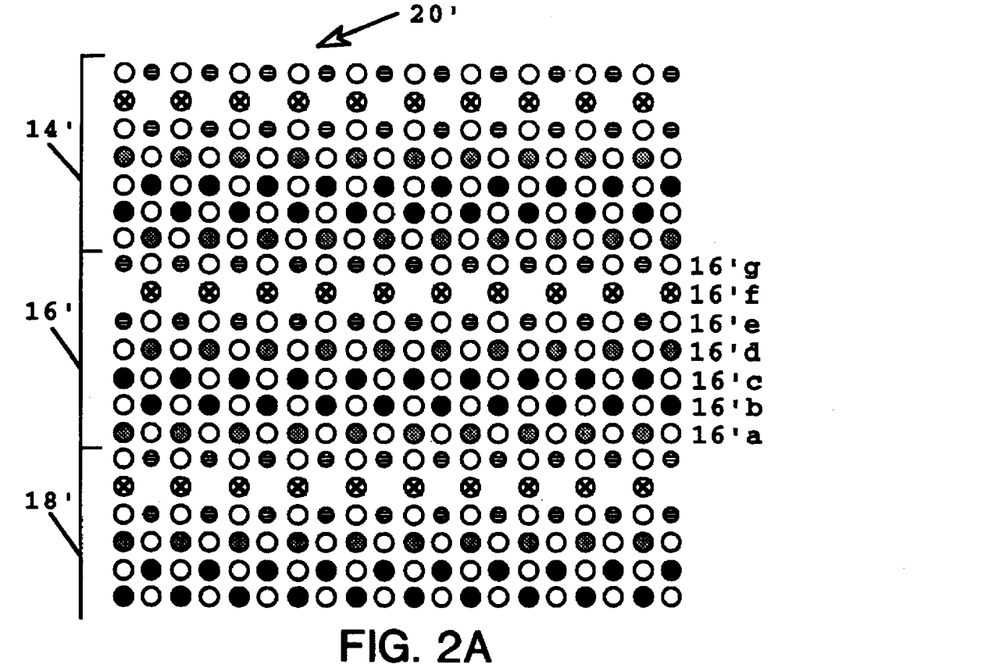
FIGS. 2A and 2B show three molecular layers of a $Bi_2Sr_2Ca_1Cu_2O_8$ oxide in the FIG. 1 thin film, illustrating layers formed without defects (2A) and with a Cu-excess defect (2B)
Figure 2B:
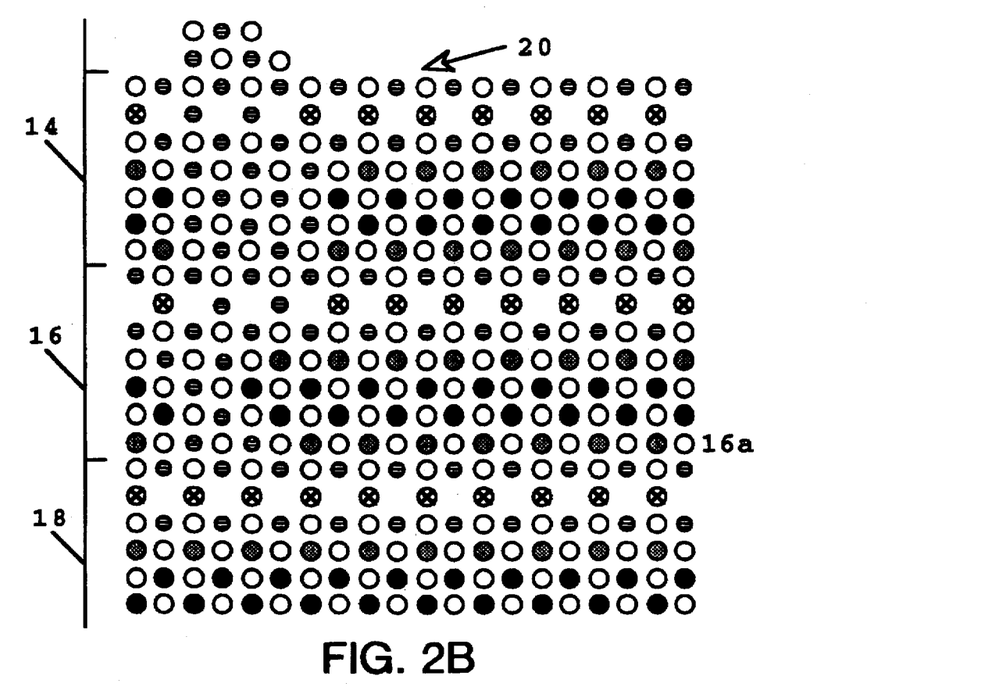

As shown in FIG. 2A, each molecular layer, such as layer 16', includes SrO atomic layers 16'a, 16'd, atomic layers of BiO 16'b, 16'c, atomic layers 16'e, 16'g of $CuO_2$ and Ca layer 16'f. FIG. 2B shows the same layers, but with a Cu excess which first appears in the lowermost atomic layer 18a of molecular layer 18, where two Sr sites are filled with Cu atoms. This defect acts to seed a $CuO_2$ imperfection which is carried into later-deposited atomic layers, eventually manifesting itself as a $CuO_2$ surface defect on the upper surface of layer 20 (the upper surface of strata 20). In a HTS device, such a defect can degrade the performance characteristics of the device. More generally, such defects tend to propagate and grow with successive layer deposition, leading ultimately to unwanted surface imperfections which make the thin film unsuitable for device microfabrication or for use in junctions devices.

Figure 3:
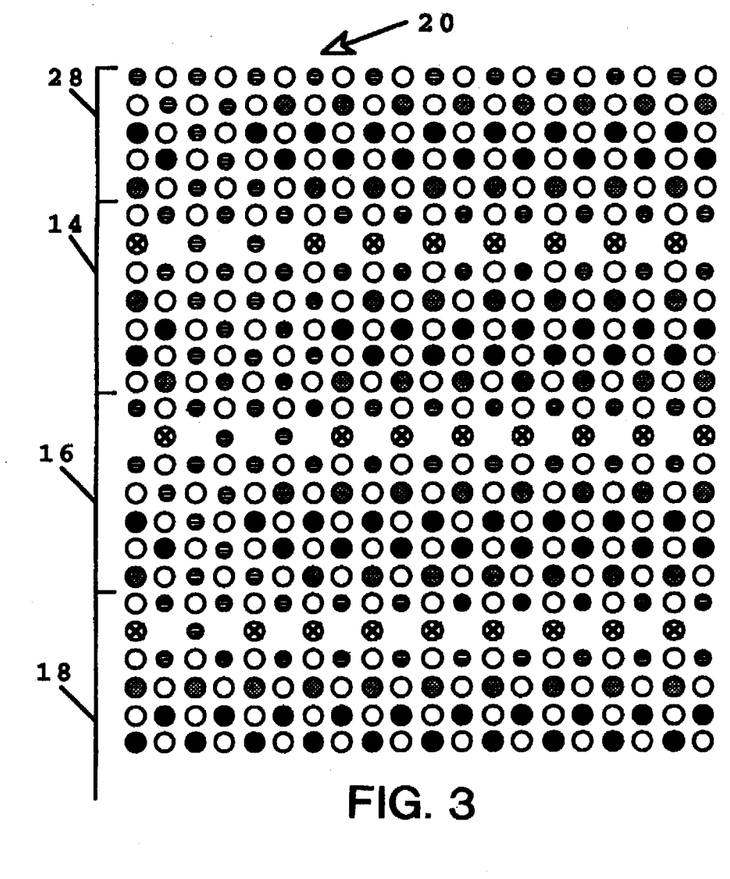
FIG. 3 illustrates how the Cu-excess defect seen in FIG. 2B is absorbed by a molecular defect-absorbing layer of a $Bi_2Sr_2CuO_6$ oxide.

FIG. 3 illustrates how a defect-absorbing layer, such as layer 28 acts to absorb a second-phase defect in the underlying strata. As seen here, lower atomic layers forming the defect-absorbing layer may contain excess Cu from the defect. However, the tendency of the simpler compound to form perfect crystalline structures over a wide temperature-pressure stoichiometric range, allows the defect to be absorbed without propagation. In the figure shown, the excess Cu defect does not propagate beyond the upper $CuO_2$ atomic layer in the defect-absorbing layer. The result is that the excess-Cu imperfection in the thin layer is confined to a small region within the upper layers of strata 20, or otherwise dissolved or absorbed by the structure.

The thin film may be constructed, as described below, to contain between from a few to several hundred or more strata, each containing a few to 20 or more molecular layers, and each separated from adjacent strata by a defect-absorbing layer. Advantages of the thin film, particularly for use in HTS applications, such as in a Josephson junctions will be considered below.

III. Method of Preparing Thin Films

The thin film of the invention can be formed by a variety of methods which enable deposition of stoichiometric or near-stoichiometric amounts of a complex metal oxide onto a substrate surface, and which can be adapted for repeated, periodic deposition of a defect-absorbing layer.

Figure 4:
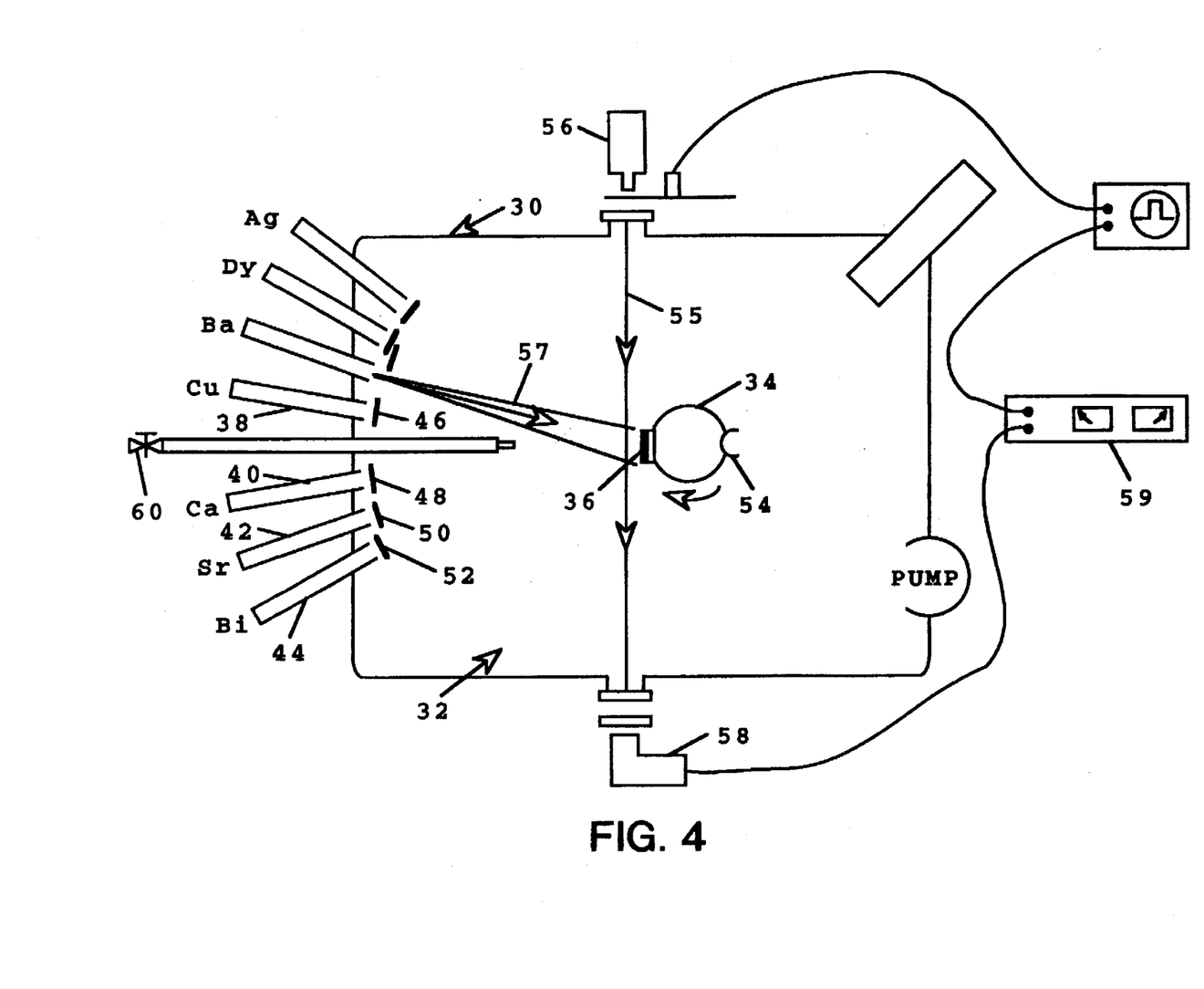
FIG. 4 is a schematic view of a beam deposition apparatus employed in carrying out the method of the invention, in one of its embodiments.

One preferred deposition method involves molecular beam deposition. FIG. 4 shows key features of one suitable apparatus 30 useful for carrying out the method. The apparatus includes a vacuum chamber 32 provided with a substrate holder 34 for positioning a substrate 36 during the deposition process. Preferably, but not necessarily, for production of a HTS device, the substrate comprises a $SrTiO_3$ wafer in order to achieve lattice matching with the deposited compound. The chamber can be evacuated to an operational pressure of less than about $10^{-8}$ Torr.

The apparatus also includes a plurality of source furnaces, such as furnaces 38, 40, 42, and 44 which in the formation of bismuth Cuprates, are used for deposition of Cu, Ca, Sr, and Bi, respectively. The source furnaces are standard thermal-source cells (Knudsen cells) which can be heated to a selected temperature, e.g., 600° C. to 750° C. for Sr and Ca, and about 1,200° C. for Cu, to produce a desired atomic beam flux from each furnace. The beams are ejected through ports in the furnaces, and these ports are equipped with individual beam shutters, such as shutters 46, 48, 50, 52, for furnaces 38, 40, 42, 44, respectively. It will be appreciated that the beams could also be produced by alternative methods, such as laser ablation.

The opening and closing of the individual beam shutters are controlled by conventional pneumatic actuators (not shown) whose operation is controlled automatically by a computer control unit (not shown). The operation of the control unit, in controlling the sequence and timing of beam deposition, through the operation of the furnace shutters, will be described below.

The apparatus is provided with an ion gauge 54 which is carried on one side of holder 34, as indicated. By rotating the holder to a position where gauge 54 is aligned with a selected beam, the beam flux can be accurately measured. Typically, the beam flux from each source is separately measured prior to and after growth, by rotating the ionization gauge 54 into the deposition position and noting the pressure change occurring when the shutter of each source is opened and closed. The resulting beam pressure readings may be converted to relative beam fluxes by means of a set of coefficients obtained from the analysis of many samples using Rutherford backscattering spectrometry to determine compositions.

Thus, the ionization gauge may be used to determine the deposition time required for the formation of each atomic layer, assuming a constant beam flux during successive layer deposition cycles. From this measurement, the time required to lay down an atomic-thickness layer of a single metal can be determined.

In addition, the atomic flux from each source may be monitored during deposition using a technique based on pseudo-double-beam atomic absorption spectroscopy (Klausmeier-Brown, et al.). All of the atomic absorption equipment resides outside the high vacuum chamber. In this technique, a mechanically chopped beam of light 55 from a hollow cathode lamp 56 passes through the atomic beam path, such as path 57, just in front of the substrate position, and is detected using a photomultiplier tube 58 and lock-in amplifier 59. Each atomic source requires its own lamp and optical path. By opening and closing the shutter during the measurement, a pseudo-double-beam effect is achieved, which makes the measurement immune to drifts in reflection and absorption by the viewport windows, gain settings on amplifiers, and lamp emission intensity.

In order to relate the atomic absorption signal from each source to the actual beam flux, calibration films are grown under identical thermodynamic conditions used for "real growths" and the resulting surface density of atoms in the film is obtained by Rutherford Back Scattering (RBS) analysis.

Oxygen is supplied to the growth chamber in the form of an ozone beam from an inlet valve 60 from any suitable source. In the embodiment shown schematically in the figure, an ozone generator (not shown) produces ozone from a suitable oxygen source. The apparatus is further provided with a pump to pump the ozone mass flow.

Oxidation of the metal atoms in a growing HTS film is obtained using a controlled flux of ozone molecules. In the case of cuprate superconductors, growth usually takes place between 600° and 750° C. At this temperature, ozone is sufficiently reactive to fully oxidize the film even with a relatively low flux of ozone to the sample. The typical oxygen background pressure is between $5.0 \times 10^{-7}$ and $2.0 \times 10^{-5}$ Torr, which permits line-of-sight beam deposition and abrupt beam flux modulation using shutters. The temperature of the heated substrate is controlled to within 1° C. using optical pyrometry.

A reflection high energy electron diffraction (RHEED) gun (not shown) and screen (not shown) in the apparatus are used for monitoring crystal structure during film deposition. This utilizes a thin, monoenergetic electron beam (8.5 KeV) which is incident on the crystal surface at a glancing angle of incidence. The electrons, with a deBroglie wavelength of about 0.15 Å, diffract from this real-space pattern, and in the far field form a k-space representation of the apparent surface periodicity. From a flat surface, the diffracted pattern is continuously streaky in one direction, since diffraction is taking place in the orthogonal direction only. In contrast, electrons incident on a surface that consists of oriented three dimensional microcrystals can pass through thin slabs of crystalline material, diffracting in both directions and giving a spotty far-field pattern similar to that seen in transmission electron microscopy. Thus, the diffraction pattern displayed provides a k-space view of the crystallographic microstructure of the surface (specifically, the lattice constants and the symmetry), its relation to the underlying film, and its flatness or roughness on an atomic scale.

The method of formation of a molecular layer, by atomic-layer-by-layer deposition, is illustrated for the case of a molecular monolayer of the $Bi_2Sr_2CaCu_2O_8$ (2212) phase, as illustrated in FIGS. 2 and 3. The steps involve successive deposition of atomic layers of SrO, BiO (two layers), SrO, $CuO_2$, Ca, and $CuO_2$. Although the apparatus can be operated in a mode in which deposition times are carefully controlled to produce single atomic layers, to minimize stoichiometric imperfections in the growing layers, one advantage of the present invention is that such imperfections are absorbed by defect-absorbing layers, allowing less controlled monitoring of the deposition levels. In particular, it is unnecessary to monitor each atomic layer by RHEED analysis to determine and correct for the presence of three-dimensional polycrystalline domains on the film surface.

After deposition of several, e.g., 4–6, molecular layers of the first metal oxide, e.g., the $Bi_2Sr_2Ca_1Cu_2O_8$ shown in FIGS. 2 and 3, the sequence of beam depositions is altered to produce a single defect-absorbing layer, such as a $Bi_2Sr_2CuO_6$ layer, designed to absorb second-phase imperfections. In the present example, the defect-absorbing layer is formed by successive deposition of atomic layers of SrO, BiO (two layers), SrO, and $CuO_2$.

Figure 5A:
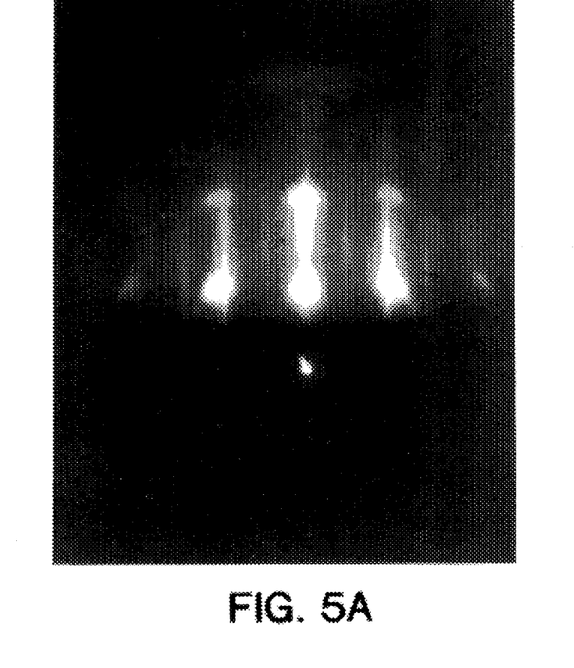
FIGS. 5A and 5B show typical RHEED diffraction patterns for a multilayer $Bi_2Sr_2Ca_1Cu_2O_8$ oxide thin film with second-phase defects (5A) and with second-phase defects absorbed by a defect-absorbing layer of $Bi_2Sr_2CuO_6$ oxide (5B)
Figure 5B:
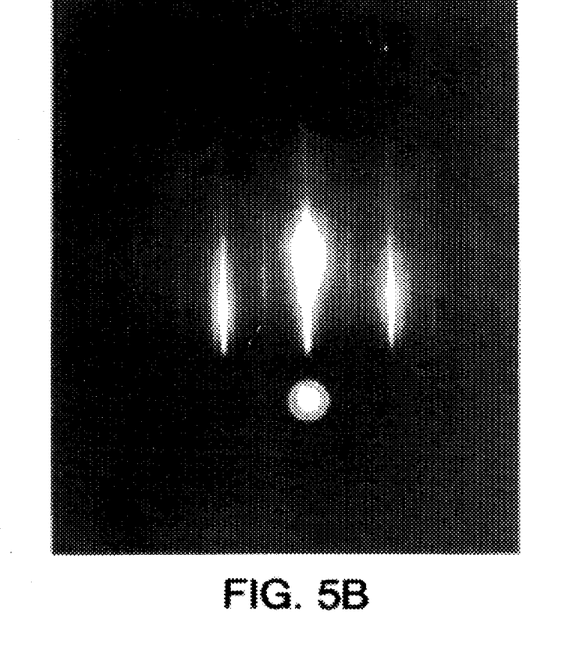

FIG. 5A shows a RHEED pattern of a $Bi_2Sr_2CaCu_2O_8$ film surface after deposition of several molecular layers. The diffuse spots superimposed on the streaky pattern indicate the growth of three-dimensional polycrystalline domains about 10 to 100 Å in size. The RHEED pattern for the same film, but after deposition of a $Bi_2Sr_2CuO_6$ molecular layer, is shown in FIG. 5B. The streaky pattern without any spots indicates a surface that is atomically smooth and without second-phase inclusions.

The film surfaces were also examined by high magnification (1000× with Nomarsky accessory) microscopy. The surface of a $Bi_2Sr_2CaCu_2O_8$ film formed without interspersed defect-absorbing layers showed multiple regions of characteristic excess-Cu related defects. These surface features were effectively eliminated in a film formed by interspersing defect-absorbing layers of $Bi_2Sr_2CuO_6$ in the film.

Figure 6:
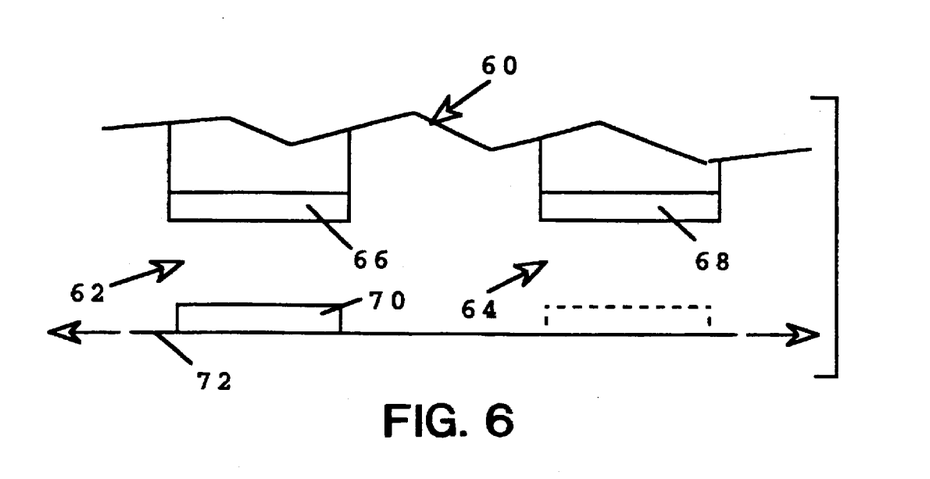
FIG. 6 is a schematic diagram of a sputtering station for use in another embodiment of the method of the invention.

FIG. 6 is a schematic illustration of a portion of a sputtering apparatus 60 designed for forming sputtered thin films in accordance with the invention. The apparatus includes a pair of sputtering stations 62, 64 having targets 66, 68, respectively, from which first and second metal oxides are sputtered. In particular, the two targets are designed for sputtering the first and second metal oxides, such as $Bi_2Sr_2CaCu_2O_8$ and $Bi_2Sr_2CuO_6$, used in forming the thin film of the invention.

A substrate 70 on which the thin film is formed is carried in the apparatus an a platform 72 which can be shifted between the solid and dashed-line positions shown in the figure, at which the substrate is placed for deposition from one or the other targets. Conventional DC magnetron or RF sputtering apparatus with multiple sputtering chambers may be employed. Other thin-film deposition methods, such as laser ablation and chemical vapor deposition (CVD), may also be employed.

From the foregoing, it will be appreciated how various objects and features of the invention are met. The invention allows the production of metal oxide films which have desired selected properties, e.g., HTS properties, but whose use in thin films may be otherwise limited by the difficulty of forming films of the oxide without second-phase defects. These advantages are illustrated below by the use of the films in a Josephson junction.

Even if a metastable metal oxide can be deposited with perfect crystal structure by carefully controlled atomic layer-by-atomic layer (ALL) deposition, as has been described by the inventors (Eckstein), the present invention allows such oxides to be used in thin-film formation under less controlled conditions, by periodically absorbing second-phase defects. In particular, ALL beam deposition can be carried out without continued monitoring for surface defects, and with less control of stoichiometry.

As indicated, film formation can also be carried out by relatively low-cost deposition methods, such as sputtering or CVD, in which second-phase defects might otherwise preclude formation of useful thin films.

IV. Josephson Junction

Figure 7:
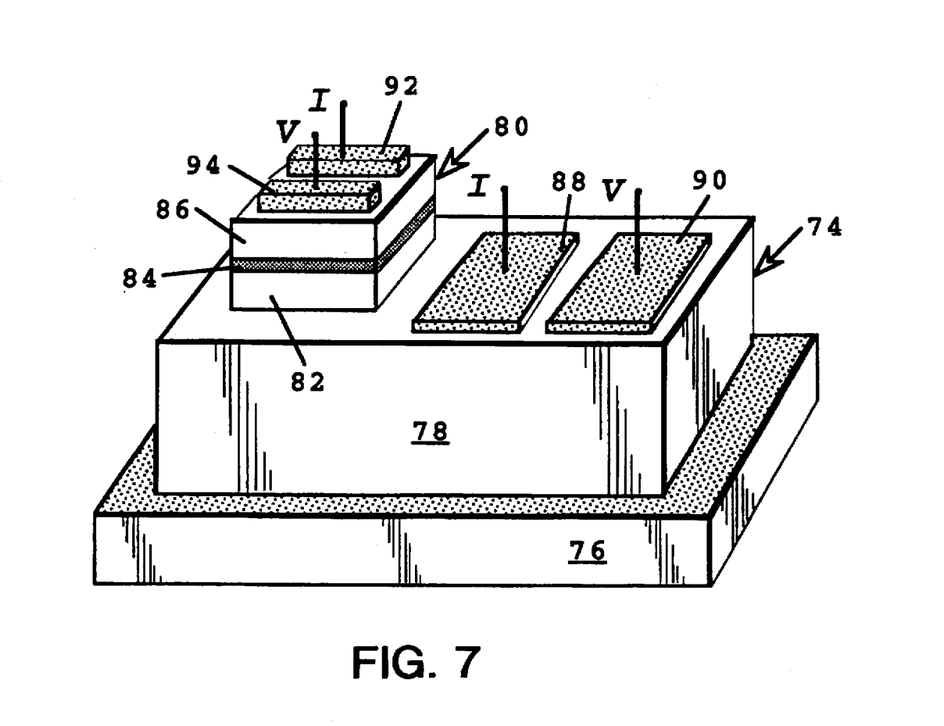
FIG. 7 is a schematic illustration of a Josephson junction constructed employing HTS thins films constructed according to the present invention.

FIG. 7 shows the elements of a hysteretic high-$T_c$ trilayer Josephson junction device 74 in accordance with the invention. The junction includes a nonconductive substrate 76, such as an $SrTiO_3$ substrate, a high-$T_c$ superconducting cuprate block 78, and formed on the block, a trilayer junction 80 composed of a lower or first HTS cuprate thin film 82, a barrier layer 84, and an upper HTS cuprate layer 86.

Electrodes 88, 90 formed on block 78, and electrodes 92, 94 formed on layer 94 are preferably silver-film electrodes. Electrodes 88, 92 serve as current electrodes, and electrodes 90, 94, as voltage electrodes. The device was constructed substantially as described in the example below, and had the surface features and performance characteristics given in the example.

EXAMPLE

A beam deposition apparatus similar to that shown in the FIG. 4 was employed to produce a thin film in accordance with the present invention. A $SrTiO_3$ wafer with a buffer layer of (low-$T_c$ superconductor) $Bi_2Sr_2CuO_6$ was heated to a temperature in the range of 650° C. to 700° C. and the background pressure employed in the growth system was about $1\times10^{-5}$ Torr. A continuous flow of ozone was directed to the growth chamber while the shutters for the source furnaces containing strontium, calcium and copper were alternatively opened and closed in order to deposit by reaction-controlled beam deposition.

This approach was employed to construct a multilayer superconducting thin film junction device composed of (i) a $Bi_{12}Sr_{1.9}CuO_6$ buffer layer, important in order to initiate good epitaxial growth, 61.5 Å thick (5 molecular layers, each 12.3 Å thick); (ii) a bottom electrode layer, which consisted of 36 layers of $Bi_{12}Sr_{1.9}Ca_{0.925}Cu_2O_8$, each 15.4 Å thick, amounting to a total of about 554 Å, (iii) a single molecular layer of the barrier material, which in this case was selected to be $Bi_2Sr_2(Bi,Sr,Ca)_7Cu_8O_{20}$, about 34 Å thick, and finally, (iv) a top electrode layer with 14 molecular layers of $Bi_{12}Sr_{1.9}Ca_{0.925}Cu_2O_8$.

In more detail, the barrier compound was layered as follows: a 0.925 layer of Sr (i.e., $SR_{0.925}$) followed by $Bi_{0.125}Sr_{0.139}Ca_{0.665}Cu_2$, then $Bi_{0.125}Sr_{0.139}Ca_{0.665}Cu$, then three times $Sr_{0.139}Ca_{0.787}Cu_{0.975}$, two times $Bi_{0.125}Sr_{0.139}Ca_{0.665}Cu_{0.975}$, followed by $Sr_{0.925}$, and finally $Bi_{2.0}$. (The deposition was performed under strong oxidizing conditions, as provided by a pure ozone beam directed at the substrate surface during the growth. Therefore, each of these layers was oxidized, although the oxygen stoichiometry is not indicated here.) Overall, this has a structure of $Bi_2Sr_2Ca_7Cu_8O_{18}$, or 2-2-7-8, with the difference in chemical doping at selected Ca sites as indicated above.

The film was patterned into devices by wet chemical etching, for device isolation, followed by ion milling, to expose the bottom 2212 electrode and to define a 30 μm×30 μm active mesa. The isolation layer for metallization consisted of sputtered $SiO_2$. Evaporated silver was used for ohmic contacts, interconnect lines, and probe pads.

The film was characterized by RHEED (in situ and in real time) and by X-ray diffraction, as well as by temperature-dependent transport measurements between 300 K. and 4 K. The device response was tested by I-V curve tracing with and without magnetic field, and also under illumination by low-power, 17.3 GHz microwave radiation. Well-defined Shapiro steps were also observed, showing clearly that Josephson junctions have been fabricated.

This example is set forth to illustrate specific embodiments of the invention and is not intended to limit the scope of the compounds and methods of the present invention. Additional embodiments and advantages within the scope of the claimed invention will be apparent to one of ordinary skill in the art.

It is claimed:

1. In the production of a thin film having selected magnetic or conductive properties, by deposition of successive molecular layers of a first high $T_c$ metal oxide which has a relatively narrow temperature-pressure-stoichimetry phase acceptance window, such that second-phase imperfections form during successive layer deposition, the improvement method comprising interspersing among said layers at multilayer intervals, a molecular layer of a second metal oxide which has a wider temperature-pressure-stoichiometry phase acceptance window than said first metal oxide, whereby the second-metal oxide layer absorbs the second-phase imperfections formed in the first metal-oxide layers;

said interspersing preserving the selected magnetic or conduction properties of said thin film while preventing nucleation of second-phase imperfections in the film wherein the ratio of the number of layers of said first high $T_c$ metal oxide to said layer of second metal oxide is R, where $R \geq 3$;

where said first high $T_c$ metal oxide layers are selected from a family of cuprate oxide polytype metal oxides including (i) $M_1Ba_2Cu_3O_7$ where $M_1$ is Y, Nd, La, Sm, Eu, Gd, Dy, Ho, Er, Tm, Yb, or Lu;
   (ii) $Bi_2Sr_2Ca_{n-1}Cu_nO_{2n+4}$ where n=2 to 5;
   (iii) $Tl_xBa_2Ca_{n-1}Cu_nO_{2n+2x+2}$ where x=1 or 2 and n=1 to 5 or
   (iv) $La_{2-x}(Sr, Ca, Ba)_xCuO_4$ where x=0 to 0.3; and wherein said second metal oxide is selected from the same polytype family as the first metal oxide and wherein said second metal oxide has simpler stoichiometry than said first metal oxide.

2. The method of claim 1, wherein said first metal oxide, but not the second metal oxide, has high $T_c$ conduction properties, when deposited in lattice matched atomic layers.

3. The method of claim 2, wherein the polytype family of said first and second metal oxides is a $Bi_2Sr_2Ca_{(n-1)}Cu_nO_{2n+4}$ oxide, where n is 2 or 3 in the first metal oxide and n is equal to 1 in the second metal oxide.

4. The method of claim 3, wherein the first metal oxide is $Bi_2Sr_2Ca_1Cu_2O_8$, and the second metal oxide is $Bi_2Sr_2CuO_6$.

5. The method of claim 3, wherein said multilayer intervals separating said layers contain about 4–10 layers.

6. The method of claim 1, wherein said molecular layers forming the film are formed by sputtering, chemical vapor deposition, or laser ablation.

7. The method of claim 1, wherein said interspersing is carried out by atomic layer-by-layer deposition of atomic metal produced by a thermal source, in the presence of ozone.

8. A method of producing a high-$T_c$ superconducting thin film which is substantially free of measurable defects due to second-phase inclusions, comprising depositing a multilayered stratum composed of molecular layers of a high-$T_c$ polytype metal oxide (HTC) characterized by a relatively narrow temperature-pressure-stoichimetry phase acceptance window, such that second-phase imperfections form during successive layer deposition, forming over said stratum by deposition, a molecular layer of a low-$T_c$ metal oxide (LTC) which has a wider temperature-pressure-stoichiometry phase acceptance window than said high Tc metal oxide, whereby the low-$T_c$ molecular layer absorbs the second-phase imperfections formed in said stratum, and repeating said depositing and forming steps until a desired number of strata interspersed with said single atomic layers are formed, where the ratio of HTC layers to LTC layers is R and where R≧3, where said first high-$T_c$ polytype metal oxide layers are selected from a family of cuprate oxide polytype metal oxides including (i) $M_1Ba_2Cu_3O_7$ where $M_1$ is Y, Nd, La, Sm, Eu, Gd, Dy, Ho, Er, Tm, Yb or Lu;

(ii) $Bi_2Sr_2Ca_{n-1}Eu_nO_{2n+4}$ where n=2 to 5;

(iii) $Tl_xBa_2Ca_{n-1}Cu_nO_{2n+2x+2}$ where X=1 or 2, and n=1 to 5 or (iv) $La_{2-x}(Sr, Ca, Ba)_xCuO_4$ where X=0 to 0.3; and wherein said second metal oxide is selected from the same polytype family as the first metal oxide and wherein said second metal oxide has simpler stoichiometry than said first metal oxide.

9. The method of claim 8, wherein the polytype family of said first and second metal oxides is a $Bi_2Sr_2Ca_{(n-1)}Cu_nO_{2n+4}$ oxide, where n is 2 or 3 in the first metal oxide and n is equal to 1 in the second metal oxide.

10. The method of claim 9, wherein the first metal oxide is $Bi_2Sr_2Ca_1Cu_2O_8$, and the second metal oxide is $Bi_2Sr_2CuO_6$.

11. The method of claim 8, wherein said strata contain about 4–10 layers.

12. The method of claim 8, wherein said depositing and forming are carried out by sputtering, chemical vapor deposition, or laser ablation.

13. The method of claim 2 wherein the polytype family of said first and second oxides is a $Tl_xBa_xCa_{n-1}Cu_nO_{2n+2x+2}$ where X=1 or 2, n is 1, and the second oxide is $Tl_xBa_2CuO_{2x+4}$.

* * * * *